(12) United States Patent
Lahgere et al.

(10) Patent No.: US 11,387,364 B2
(45) Date of Patent: Jul. 12, 2022

(54) TRANSISTOR WITH PHASE TRANSITION MATERIAL REGION BETWEEN CHANNEL REGION AND EACH SOURCE/DRAIN REGION

(71) Applicant: GLOBALFOUNDRIES U.S. Inc., Santa Clara, CA (US)

(72) Inventors: Avinash Lahgere, Bangalore (IN); Prashanth Paramahans Manik, Bangalore (IN); Peter Javorka, Dresden (DE); Ali Icel, Cupertino, CA (US); Mohit Bajaj, Bangalore (IN)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/087,681

(22) Filed: Nov. 3, 2020

(65) Prior Publication Data

US 2022/0140131 A1    May 5, 2022

(51) Int. Cl.
*H01L 29/78* (2006.01)
*H01L 29/786* (2006.01)
(Continued)

(52) U.S. Cl.
CPC ........ *H01L 29/785* (2013.01); *H01L 29/0665* (2013.01); *H01L 29/66803* (2013.01); *H01L 29/78696* (2013.01)

(58) Field of Classification Search
CPC ...................... H01L 29/4983; H01L 29/66545
See application file for complete search history.

(56) References Cited

U.S. PATENT DOCUMENTS 6,274,916 B1   8/2001   Donath et al.
6,333,543 B1   12/2001  Schrott et al.
(Continued)

FOREIGN PATENT DOCUMENTS

WO    2011152938 A1    12/2011

OTHER PUBLICATIONS

Aziz et al., "Steep Switching Hybrid Phase Transition FETs (Hyper-FET) for Low Power Applications: A Device-Circuit Co-design Perspective—Part I", IEEE Transition On Electron Devices, Mar. 2017, vol. 64, No. 3, pp. 1-8.

(Continued)

*Primary Examiner* — Changhyun Yi
(74) *Attorney, Agent, or Firm* — Hoffman Warnick LLC

(57) ABSTRACT

A transistor includes a semiconductor substrate, a first source/drain region and a second source/drain region in the semiconductor substrate with a channel region between the source/drain regions, and a gate over the channel region. In addition, the transistor includes a first phase transition material (PTM) region between the first source/drain region and the channel region, and a second PTM region between the second source/drain region and the channel region. The PTM regions provide the transistor with improved off-state current ($I_{OFF}$) without affecting the on-state current ($I_{ON}$), and thus an improved $I_{ON}/I_{OFF}$ ratio. The transition threshold of PTM regions from dielectric to conductor can be customized based on, for example, PTM material type, doping therein, and/or strain therein.

20 Claims, 4 Drawing Sheets

(51) Int. Cl.
*H01L 29/06* (2006.01)
*H01L 29/66* (2006.01)

(56) References Cited

U.S. PATENT DOCUMENTS

| | | |
|---|---|---|
| 6,365,913 B1 | 4/2002 | Misewich et al. |
| 6,555,393 B2 | 4/2003 | Schrott et al. |
| 6,613,658 B2 | 9/2003 | Koyama et al. |
| 6,933,553 B2 | 8/2005 | Kim et al. |
| 7,408,217 B2 | 8/2008 | Yoon et al. |
| 8,395,942 B2 | 3/2013 | Samachisa et al. |
| 8,507,948 B2 | 8/2013 | Cappellani et al. |
| 2013/0075817 A1* | 3/2013 | Cheng ............ H01L 29/78696 257/347 |
| 2013/0078777 A1 | 3/2013 | Cheng et al. |
| 2013/0203248 A1 | 8/2013 | Ernst et al. |
| 2014/0110765 A1* | 4/2014 | Murali ............ H01L 29/4966 257/288 |

OTHER PUBLICATIONS

S. Gundapaneni et al., "Effect of Band-to-Band Tunneling on Junctionless Transistors", IEEE Transactions on Electron Devices, vol. 59, No. 4, Apr. 2012, pp. 1023-1029. doi: 10.1109/TED.2012. 2185800.

Lahgere et al., "A Tunnel Dielectric-Based Junctionless Transistor With Reduced Parasitic BJT Action", Aug. 2017, vol. 64, No. 8, pp. 1-6.

Yang et al., "Oxide Electronics Utilizing Ultrafast Metal-Insulator Transitions", Reviews In Advance, Feb. 2011, pp. 1-31.

Elsa Abreu et al., "THz spectroscopy of VO2 epitaxial films: controlling the anisotropic properties trough strain engineering", New Journal of Physics, 2012, 14 083026, pp. 1-20.

H. Kim et al., "Control of metal-insulator transition temperature in VO2 thin films grown on RuO2/TiO2 templates by strain modification", AIP Advances 9, 015302 (2019); https://doi.org/10.1063/1.5083848, pp. 1-7.

* cited by examiner

TRANSISTOR WITH PHASE TRANSITION MATERIAL REGION BETWEEN CHANNEL REGION AND EACH SOURCE/DRAIN REGION

BACKGROUND

The present disclosure relates to transistors, and more specifically, to a transistor with a phase transition material region between the channel region and each source/drain region.

Advanced manufacturing of integrated circuits requires formation of individual circuit elements, e.g., transistors and the like, based on specific circuit designs. A transistor generally includes a source region, a drain region, and a gate. The gate is placed between the source and drain regions and controls the current through a channel region between the source and drain regions. Transistors may be formed over a semiconductor substrate and may be electrically isolated with an insulating dielectric layer, e.g., inter-level dielectric (ILD) layer. Contacts may be formed to each of the source, drain, and gates through the dielectric layer in order to provide electrical connection between the transistors and other circuit elements that may be formed subsequent to the transistor in other metal levels.

A junctionless transistor includes a thin body metal-oxide semiconductor (MOS) transistor in which the source region, channel region and drain region are uniformly doped with a high concentration of the same type. Accordingly, this type device does not require the common complementary doping from the source/drain regions to the channel region that creates doping junctions. One challenge with junctionless transistors is that they have a very high off-current ($I_{OFF}$), e.g., approximately 1 micro-Ampere per micrometer ($\mu A/\mu m$) in the presence of band-to-band tunneling (BTBT). Band-to-band tunneling can occur where the conduction band of the intrinsic (un-doped) region aligns with the valence band of the p-type doped region. In this situation, electrons from the valence band of a channel region enter (tunnel) into the conduction band of the drain region, creating a parasitic bipolar junction transistor (BJT) and causing leakage current to flow across the transistor in what is supposed to be an off state. Consequently, these devices also have a low on-current to off-current ratio ($I_{ON}/I_{OFF}$), which limits the use of these devices. One approach to address the issue employs a thin oxide region in the channel region to suppress the parasitic BJT and reduce the leakage current. However, the use of an oxide region disadvantageously reduces the on-current ($I_{ON}$), thus limiting the desirability of using this approach. Properly positioning the oxide region in the channel region and with the proper thickness to provide the desired performance also presents a number of manufacturing challenges.

SUMMARY

An aspect of the disclosure is directed to a transistor, comprising: a semiconductor substrate; a first source/drain region and a second source/drain region in the semiconductor substrate; a channel region between the first source/drain region and the second source/drain region in the semiconductor substrate; a first phase transition material (PTM) region between the first source/drain region and the channel region; a second PTM region between the second source/drain region and the channel region; and a gate over the channel region.

Another aspect of the disclosure includes a transistor, comprising: a semiconductor substrate; a first source/drain region and a second source/drain region in the semiconductor substrate; a channel region between the first source/drain region and the second source/drain region in the semiconductor substrate; a first phase transition material (PTM) region between the first source/drain region and the channel region; a second PTM region between the second source/drain region and the channel region; a gate over the channel region; and a spacer about the gate, wherein the first PTM region and the second PTM region are aligned under the spacer in the semiconductor substrate, and wherein each PTM region includes a material selected from a group comprising: vanadium dioxide ($VO_2$), and vanadium oxide ($V_2O_5$), and wherein the first source/drain region and the second source/drain region and the channel region include a semiconductor material.

Yet another aspect of the disclosure relates to a method, comprising: forming a first phase transition material (PTM) region between a first source/drain region and a channel region in a semiconductor substrate, and a second PTM region between a second source/drain region and the channel region in the semiconductor substrate; and forming a gate over the channel region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
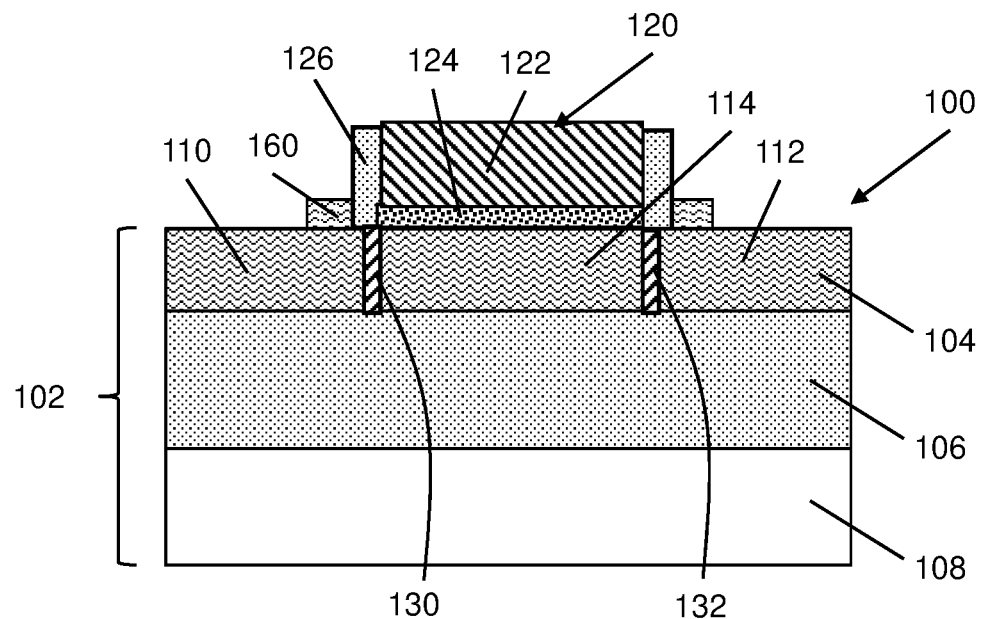
FIG. 1 shows a cross-sectional view of a transistor, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or semiconductor substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a transistor including a semiconductor substrate, a first source/drain region and a second source/drain region in the semiconductor substrate with a channel region between the source/drain regions, and a gate over the channel region. In addition, the transistor includes a first phase transition material (PTM) region between the first source/drain region and the channel region, and a second PTM region between the second source/drain region and the channel region. Phase transition material (PTM) is any of various metallic elements or alloys, such as vanadium dioxide ($VO_2$) or vanadium oxide ($V_2O_5$), that have valence electrons in two shells instead of only one. A characteristic of a PTM is that it behaves as an insulator at room temperature but as a conductor (metal) based on, for example, PTM material type, dopant therein, and/or strain therein. The transition can be triggered by application of a threshold temperature-, electric-, optic-, and/or magnetic-driven excitations. For example, vanadium dioxide ($VO_2$) transitions from a dielectric to a conductor above 20° C. This behavior is also known as metal-insulator transition or phase change. The materials may also be referred to as transition metals. Embodiments of the disclosure provide a transistor with improved off-state current ($I_{OFF}$) without affecting the on-state current ($I_{ON}$), and thus an improved $I_{ON}/I_{OFF}$ ratio. At a low bias in the device that creates a low temperature, the PTM acts as a dielectric, avoiding parasitic BJT and leakage current. At a desired bias that creates a temperature above the PTM transition temperature, the PTM turns into a conductor with low resistivity. The conductor with low resistivity does not affect the on-state current ($I_{ON}$). Further, the on-state current ($I_{ON}$) has less sensitivity to PTM thickness variation. The PTM regions may be formed as self-aligned structures, making them relatively easy to fabricate. As will be described, the electric field at which the transition occurs can be customized based on, for example, PTM material type, dopants therein, and/or strain therein. The transition can be triggered by application of a threshold temperature-, electric-, optic-, and/or magnetic-driven excitation.

FIG. 1 shows a cross-sectional view of a transistor 100 according to embodiments of the disclosure. Transistor 100 is illustrated for purposes of description as a planar metal-oxide semiconductor field effect transistor (MOSFET). It is emphasized that the teachings of the disclosure are not limited to a planar MOSFET, and may be applied to a variety of FET types such as but not limited to fin-type FETs, nanowires, nanosheets, etc.

Embodiments of transistor 100 include a semiconductor substrate 102. For purposes of description, semiconductor substrate 102 is illustrated and described as a semiconductor-on-insulator (SOI) substrate 103. SOI substrate 103 includes a layered semiconductor-insulator-semiconductor substrate in place of a more conventional silicon substrate (bulk substrate). SOI substrate 103 includes a semiconductor-on-insulator (SOI) layer 104 over a buried insulator layer 106 over a base semiconductor layer 108. SOI layer 104 and base semiconductor layer 108 may include but are not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Buried insulator layer 106 may include any appropriate dielectric such as but not limited to silicon dioxide, i.e., forming a buried oxide (BOX) layer. A portion of or the entire semiconductor substrate may be strained. The precise thickness of buried insulating layer 106 and SOI layer 104 may vary widely with the intended application. In one non-limiting example, SOI layer 104 has a thickness of no greater than 10 nanometers.

Transistor 100 also includes a first source/drain region 110 and a second source/drain region 112 in semiconductor substrate 102, and more particularly, SOI layer 104. A channel region 114 is between first source/drain region 110 and second source/drain regions 112 in semiconductor substrate 102, i.e., in SOI layer 104. In one non-limiting example, transistor 100 is a junctionless transistor, meaning first source/drain region 110 and second source/drain regions 112 and channel region 114 have a substantially uniform dopant concentration. The dopant type may vary depending on the type of transistor to be provided, i.e., either n-type or p-type. N-type dopants are elements that are introduced to a semiconductor to generate free electrons (by "donating"

electrons to semiconductor); and must have one more valance electron than the semiconductor. Common n-type dopants in silicon (Si) include: phosphorous (P), arsenic (As), antimony (Sb); and in gallium arsenic (GaAs) include: sulphur (S), selenium (Se), tin (Sn), silicon (Si), and carbon (C). P-type dopants are elements that are introduced to a semiconductor to generate a free hole (by "accepting" electron from semiconductor atom and "releasing" hole at the same time); and must have one valence electron less than the host semiconductor. Common p-type dopants include boron (B), indium (In) and gallium (Ga). In one non-limiting example, first source/drain region 110 and second source/drain region 112 and channel region 114 may have a dopant concentration of greater than $10^{19}$ cm$^{-3}$.

Transistor 100 also includes a gate 120 over channel region 114. Gate 120 may include any now known or later developed gate material. Gate 120 may include a gate body 122, and a gate dielectric layer 124 between gate body 122 and channel region 114. In one embodiment, gate body 122 may include polysilicon, which may be doped with any appropriate dopant such as but not limited to: boron (B). The boron-doped polysilicon may be formed, for example, by low-pressure chemical vapor deposition (LPCVD) with boron doping in-situ or by implantation. In another embodiment, gate body 122 may include a metal gate body, which may include one or more conductive components for providing a gate terminal of a transistor. Metal gate bodies may include a number of layers (not all shown for clarity) including, for example, a high dielectric constant (high-K) layer (gate dielectric layer 124), a work function metal layer and a gate conductor. For metal gates, gate dielectric layer 124 may include any now known or later developed high-K material typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). For non-metal gates, gate dielectric layer 124 may include silicon oxide. For metal gates, the work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor may include any now known or later developed gate conductor such as copper (Cu). A gate cap (not shown) of, for example, a nitride, may also be formed over the gate.

Transistor 100 may also include a spacer 126 about gate 120. Spacer 126 may include any appropriate spacer material such as but not limited to a nitride, e.g., silicon nitride.

Transistor 100 also includes a first phase transition material (PTM) region 130 between first source/drain region 110 and channel region 114, and a second PTM region 132 between second source/drain region 110 and channel region 114. As noted, PTM is any of various metallic element(s) or alloy(s) that have valence electrons in two shells instead of only one. In contrast, as noted herein, first and second source/drain regions 110, 112 and channel region 114 include a semiconductor material, i.e., doped semiconductor material. First PTM region 130 and second PTM region 132 contact buried insulator layer 106.

Depending on temperature, each of first and second PTM region 130, 132 has one of two states: a dielectric (insulative) state and a conductive state. For example, vanadium dioxide ($VO_2$) transitions from a dielectric to a conductor above 20° C. The transition temperature can be controlled by applying a voltage (electric bias) in first and second source/drain regions 110, 112 and across channel region 114. The electric field, and consequently the transition temperature, at which the transition from dielectric to conductor occurs in PTM regions 130, 132 can be customized based on, for example, PTM material type, dopants therein and/or strain therein. The transition can be triggered by application of a threshold temperature-, electric-, optic-, and/or magnetic-driven excitations. In one example, the transition temperature for vanadium dioxide ($VO_2$) is around room temperature, i.e., about 20° C., but can be raised to about 100° C. with addition of, for example, germanium (Ge) dopants. Strain can also be induced therein in any now known or later developed manner including but not limited to: addition of certain dopants, application of stress liners, etc. In one example, the material of PTM regions 130, 132 can be customized to provide the desired phase/state transition at the desired electric field to obtain the desired performance. However, the transition can additionally or alternatively be triggered by application of at least one of a thermal-, electric-, optic-, and magnetic-driven excitations. For reasons to be described herein, first and second PTM regions 130, 132 may be aligned under spacer 126 in semiconductor substrate 102. That is, they are self-aligned under spacer 126.

As noted, embodiments of the disclosure including transistor 100 with PTM regions 130, 132 provide improved off-state current ($I_{OFF}$) without affecting the on-state current ($I_{ON}$), and thus an improved $I_{ON}/I_{OFF}$ ratio. At a low electric field bias, a low temperature is created and PTM regions 130, 132 act as a dielectric, avoiding parasitic BJT and the resulting leakage current. At a desired electric field, a temperature above the PTM region 130, 132 transition temperature is created, and the PTM regions 130, 132 transition into a conductor with low resistivity. The low resistivity does not affect the on-state current ($I_{ON}$). Another advantage of PTM regions 130, 132 is that the on-state current ($I_{ON}$) has less sensitivity to thickness variation of PTM regions 130, 132.

Transistor 100 may be formed in a number of ways. FIGS. 2-8 show one illustrative method of forming transistor 100. FIGS. 2-6 collectively show forming first PTM region 12 between first source/drain region 110 and channel region 114 in semiconductor substrate 102, and second PTM region 132 between second source/drain region 112 and channel region 114 in semiconductor substrate 102, and forming gate 122 over channel region 114.

Figure 2:
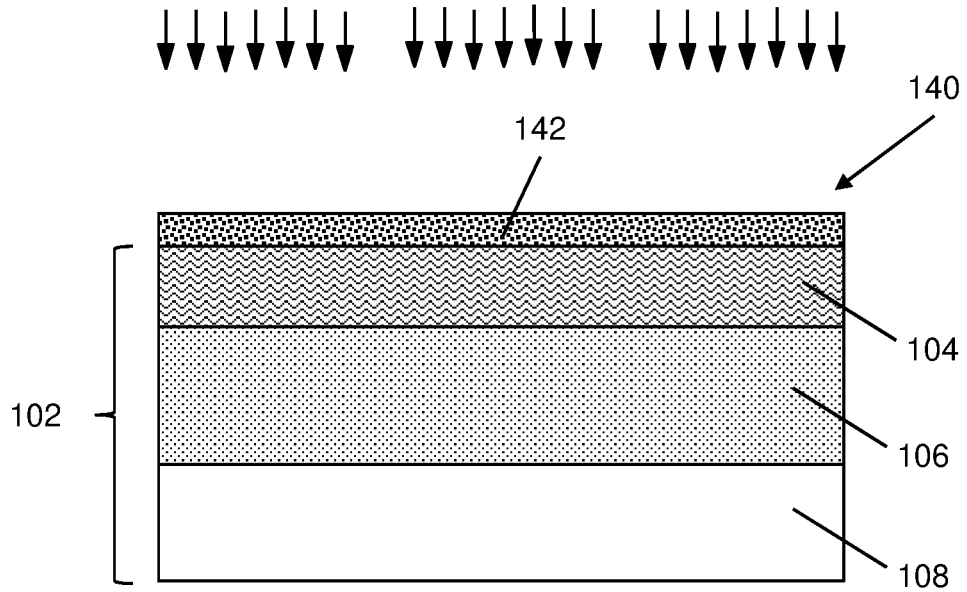
FIG. 2 shows a cross-sectional view of a preliminary structure for a method including a semiconductor substrate, according to embodiments of the disclosure.

FIG. 2 shows a cross-sectional view of a preliminary structure 140 including semiconductor substrate 102. Semiconductor substrate 102, e.g., SOI substrate 103, may be provided using any now known or later developed semiconductor fabrication processing. Preliminary structure 140 may also include a barrier layer 142 thereon. Barrier layer 142 may be formed using any appropriate deposition technique for the material used. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Here, barrier layer 142 may be deposited using, for example, ALD, and may include silicon oxide.

FIG. 2 also shows doping SOI layer 104 (arrows). Doping is the process of introducing impurities (dopants) into the semiconductor substrate and is often performed with a mask (or previously-formed elements) in place so that only certain areas of the substrate will be doped. For example, doping may be used to form source/drain regions 110, 112 (FIG. 1) and/or a channel region 114 (FIG. 1) of transistor 100 (FIG. 1). As will be described, dopants introduced in FIG. 2 will eventually be part of channel region 114 (FIG. 1). Dopants may be introduced during layer forming, e.g., during deposition, or by implanting and subsequent anneal. Usually in implanting type doping, a dopant, a dosage and an energy level, are specified and/or a resulting doping level may be specified. A dosage may be specified in the number of atoms per square centimeter (atoms/cm$^2$) and an energy level (specified in keV, kilo-electron-volts), resulting in a doping level (concentration in the substrate) of a number of atoms per cubic centimeter (atoms/cm$^3$)(abbreviated cm$^{-3}$). The number of atoms is commonly specified in exponential notation, where a number like "3E15" means 3 times 10 to the 15th power, or a "3" followed by 15 zeroes (3,000,000,000,000,000). Any dopant described herein may be introduced to SOI layer 104 and at any appropriate dosage and energy level, e.g., phosphorus with a dosage of between about 1E16 atoms/cm$^2$, and an energy of about to 30 keV. The doping concentration may vary but in one non-limiting example may be greater than $10^{19}$ cm$^{-3}$ (1E19 cm$^{-3}$). Any necessary annealing process to drive-in the dopants may be subsequently performed, e.g., a rapid thermal anneal (RTA).

Figure 3:
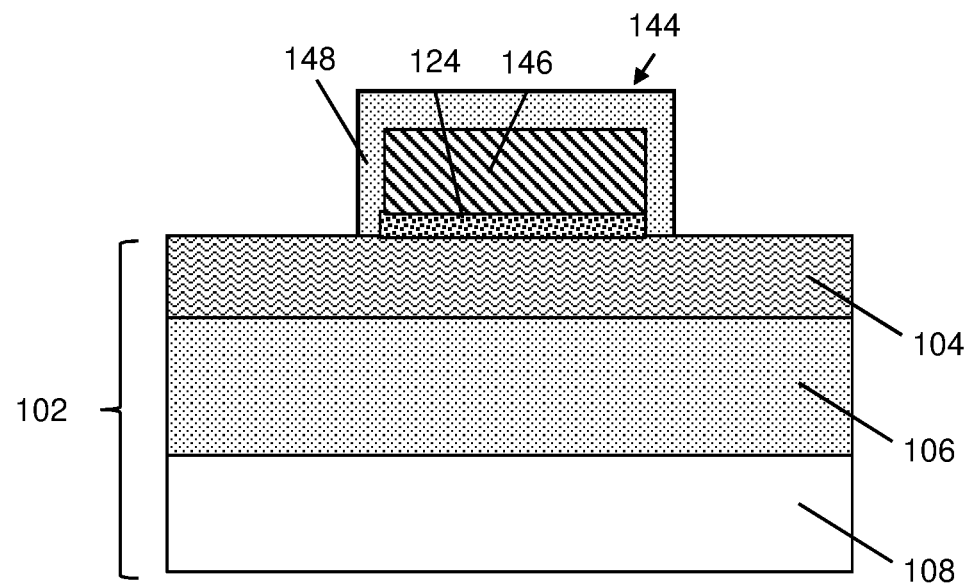
FIG. 3 shows a cross-sectional view of forming a gate structure on the semiconductor substrate, according to embodiments of the disclosure.

FIG. 3 shows a cross-sectional view after formation of a gate structure 144 over SOI substrate 102. Gate structure 144 may include a gate body 146 and a spacer (layer) 148 thereabout. A gate dielectric layer 124 may be formed over barrier layer 142 (FIG. 2) (i.e., incorporating barrier layer 142 therein where dielectric layer 124 includes the same material), or a new gate dielectric layer 124 may replace barrier layer 142 (FIG. 2). At this stage, where a replacement metal gate (RMG) process is used, gate body 146 may include a sacrificial material such as polysilicon or amorphous silicon. As understood in the art, during the RMG process a dummy gate body of sacrificial material is used as a placeholder for the final gate body material during subsequent processing, e.g., dopant drive-in anneals, that would otherwise damage the final gate body material. In a gate-first approach, gate body 146 would include the same materials listed for gate body 122 (FIG. 1) of transistor 100 (FIG. 1), e.g., a boron-doped polysilicon or metal gate materials. In any event, as illustrated, gate structure 144 is patterned to the desired shape/size for gate 120 (FIG. 1), using any now known or later developed semiconductor fabrication techniques, e.g., material deposition, mask patterning, etching, etc.

Figure 4:
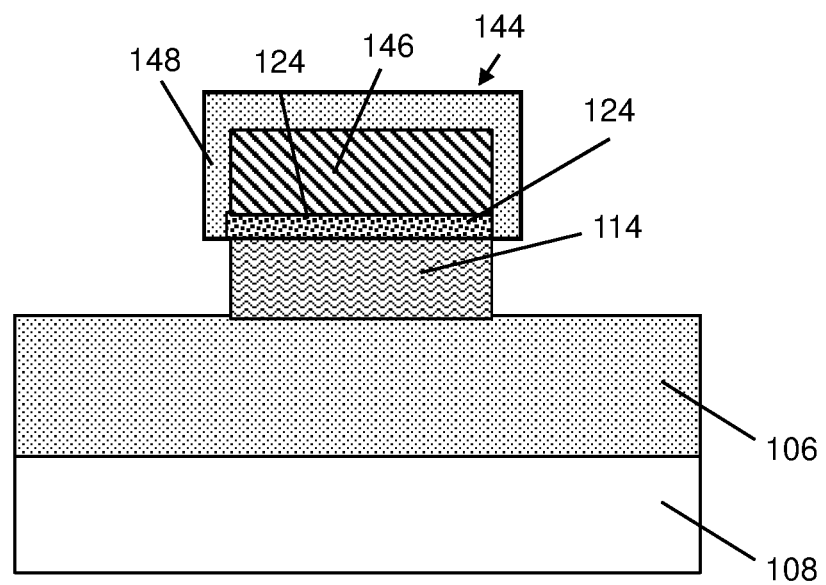
FIG. 4 shows a cross-sectional view of removing portions of a semiconductor-on-insulator layer of the semiconductor substrate, according to embodiments of the disclosure.

FIG. 4 shows a cross-sectional view of etching, using gate structure 144 as a mask, to remove an upper layer of semiconductor substrate 102, e.g., SOI layer 104, from under spacer layer 148, leaving channel region 114 under gate body 146. Etching generally refers to the removal of material from a substrate (or structures formed on the substrate), and is often performed with a mask in place (here, gate structure 144) so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (RIE) operates under conditions intermediate between sputter and plasma etching and may be used to produce deep, narrow features, such as STI trenches. Here, a RIE may be used.

Figure 5:
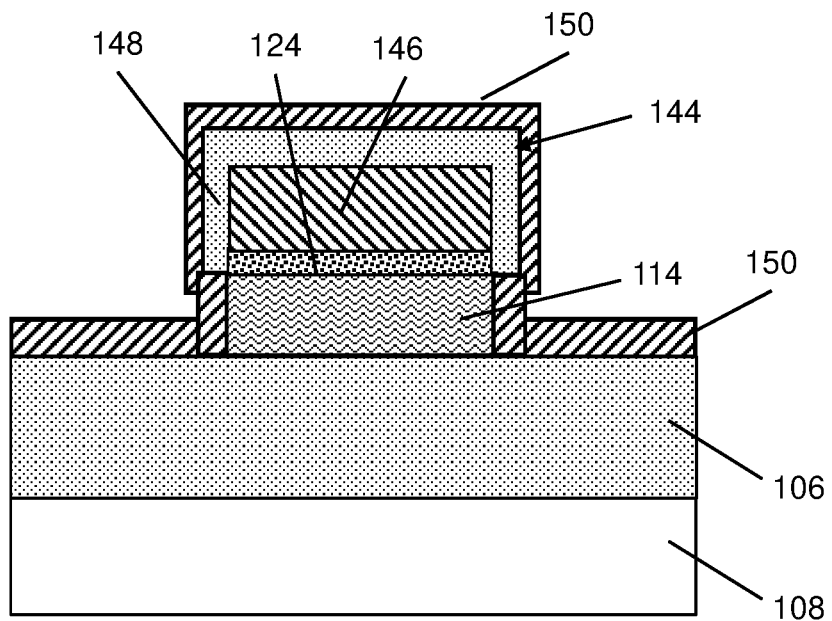
FIG. 5 shows a cross-sectional view of forming a phase transition material layer over the semiconductor substrate including under a spacer of the gate structure, according to embodiments of the disclosure.

FIG. 5 shows a cross-sectional view of forming a phase transition material (PTM) layer 150 on semiconductor substrate 102 (minus SOI layer 104 in some parts). PTM layer 150 extends under spacer (layer) 148. PTM layer 150 may be formed, for example, by deposition using any appropriate deposition technique for the material used, e.g., ALD of vanadium dioxide. As shown in FIG. 5, PTM layer 150 under spacer 126 (i.e., in undercut of spacer 126) has a larger volume than on sidewalls of gate structure 144. PTM layer 150 can be formed to create a predefined transition threshold (metal-insulator transition (MIT)) for PTM regions 130, 132 from a dielectric to a conductor based PTM layer 150 material, doping therein and/or strain therein. For example, germanium may be added as a dopant to raise a transition temperature of the PIM material. The transition can be implemented by application of at least one of a thermal-, electric-, optic-, magnetic-driven excitation.

Figure 6:
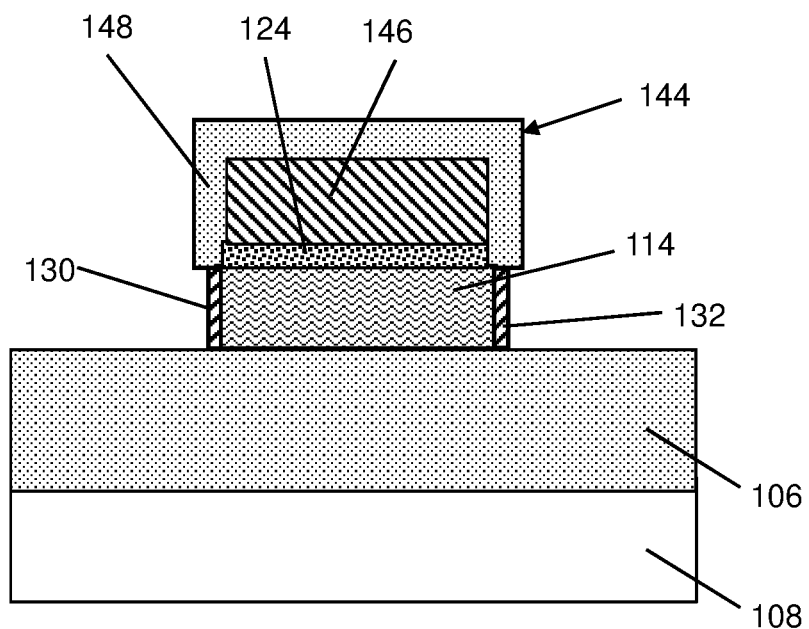
FIG. 6 shows a cross-sectional view of forming phase transition material regions under a spacer of the gate structure, according to embodiments of the disclosure.

FIG. 6 shows a cross-sectional view of removing PTM layer 150 (FIG. 5) from over semiconductor substrate 102, forming first and second PTM regions 130, 132 under spacer (layer) 148 with channel region 114 therebetween. More particularly, first PTM region 130 is adjacent channel region 114, and second PTM region 132 is adjacent channel region 114. PTM layer 150 may be removed by etching, e.g., using a RIE. Since PTM layer 150 has a larger volume under spacer 126, PTM layer 150 can be removed from sidewalls of gate structure 144, yet remain under spacer 126, creating PTM regions 130, 132. As illustrated, using this process, PTM regions 130, 132 may be advantageously formed as self-aligned structures, making them relatively easy to fabricate.

Figure 7:
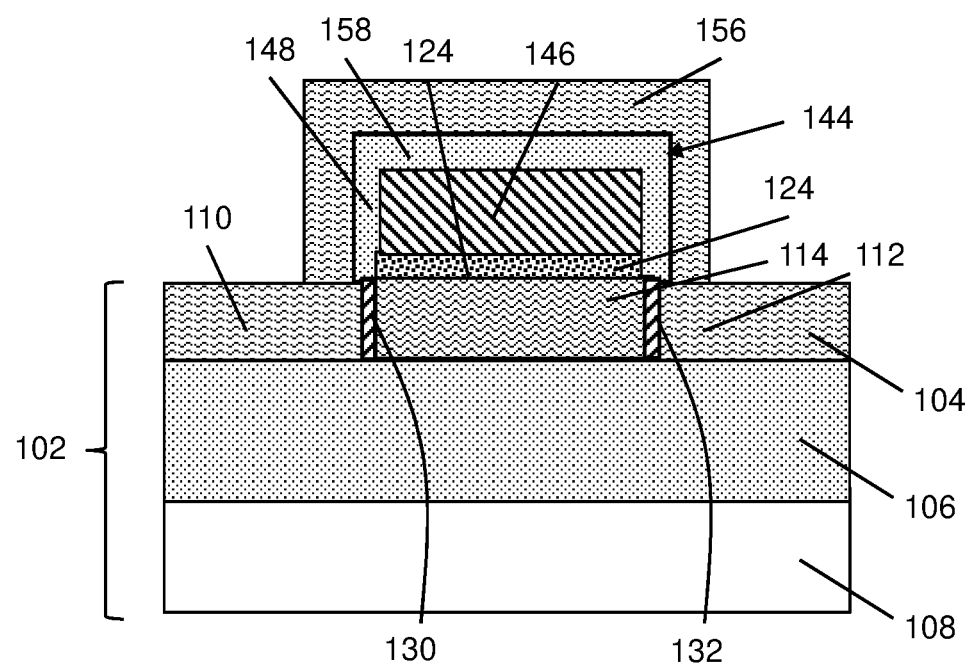
FIG. 7 shows a cross-sectional view of forming a semiconductor layer and source/drain regions, according to embodiments of the disclosure.

FIG. 7, along with FIG. 1, shows a cross-sectional view of forming first source/drain region 110 on semiconductor substrate 102 adjacent first PTM region 130, and second source/drain region 112 on semiconductor substrate 102 adjacent second PTM region 132. In one embodiment, this process may include, as shown in FIG. 7, forming a semiconductor layer 156 over the substrate (layers 106, 108) adjacent each of first and second PTM regions 130, 132.

Semiconductor layer 156 may include, for example, polysilicon epitaxially grown over buried insulator layer 106. Hence, semiconductor layer 156 re-forms SOI layer 104 (FIG. 1), where previously removed. As shown in FIG. 1, semiconductor layer 156 (FIG. 7) may be patterned into any shape desired, taking the form of SOI layer 104. For example, a mask layer may be formed over the structure, planarized, and then etched to form semiconductor spacer 160 (FIG. 1) about spacer 126. Doping may be performed to form the first and second source/drain regions 110, 112. The doping may occur in-situ during formation of semiconductor layer 156, or by implanting/annealing dopant after patterning of semiconductor layer 156. In any event, in one embodiment, first and second source/drain regions 110, 112 and channel region 114 have a substantially uniform dopant concentration of the same type dopant. Base semiconductor layer 108 typically has the opposite type dopant as first and second source/drain regions 110, 112 and channel region 114. As noted, in one non-limiting example, first and second source/drain regions 110, 112 and channel region 114 may have a dopant concentration of greater than $10^{19}$ cm$^{-3}$. Each PTM region 130, 132 may include vanadium dioxide (VO$_2$) and/or vanadium oxide (V$_2$O$_5$), and first and second source/drain regions 110, 112 and channel region 114 include a semiconductor material. As shown in FIG. 1, an upper portion 158 (FIG. 7) of spacer layer 148 (FIG. 7) may be planarized off of gate body 122, resulting in spacer 126, e.g., using chemical-mechanical polishing or other planarization technique.

If using a gate-first approach, gate body 122 is formed including the same material as illustrated in FIG. 7. If using an RMG approach, gate body 122 would be replaced using any now known or later developed RMG process with a metal gate body, as described herein.

The method as described above is used in the fabrication of integrated circuit chips. While a particular embodiment of a method of forming transistor 100 is illustrated, a variety of alternative methods may also be employed, and are considered within the scope of the disclosure. In any event, the resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A transistor, comprising:
   a semiconductor substrate;
   a first source/drain region and a second source/drain region in the semiconductor substrate;
   a channel region between the first and second source/drain regions in the semiconductor substrate;
   a first phase transition material (PTM) region horizontally between the first source/drain region and the channel region;
   a second PTM region horizontally between the second source/drain region and the channel region; and
   a gate over the channel region.

2. The transistor of claim 1, wherein the first source/drain region and the second source/drain region and the channel region have a substantially uniform dopant concentration, forming a junctionless transistor.

3. The transistor of claim 2, wherein the first source/drain region and the second source/drain region and the channel region have a dopant concentration of greater than $10^{19}$ cm$^{-3}$.

4. The transistor of claim 1, further comprising a spacer about the gate, wherein the first PTM region and the second PTM region are aligned under the spacer in the semiconductor substrate.

5. The transistor of claim 1, wherein each PTM region includes a material selected from a group comprising: vanadium dioxide (VO$_2$), and vanadium oxide (V$_2$O$_5$), and
   wherein the first source/drain region and the second source/drain region and the channel region include a semiconductor material.

6. The transistor of claim 1, wherein, depending on temperature, each first and second PTM region has one of two states: a dielectric state and a conductive state.

7. The transistor of claim 1, wherein the semiconductor substrate includes a semiconductor-on-insulator (SOI) substrate including a semiconductor-on-insulator (SOI) layer over a buried insulator layer over a base semiconductor layer, wherein the first PTM region and the second PTM region contact the buried insulator layer.

8. The transistor of claim 7, wherein the SOI layer has a thickness of no greater than 10 nanometers.

9. A transistor, comprising:
a semiconductor substrate;
a first source/drain region and a second source/drain region in the semiconductor substrate;
a channel region between the first source/drain region and the second source/drain region in the semiconductor substrate;
a first phase transition material (PTM) region between the first source/drain region and the channel region;
a second PTM region between the second source/drain region and the channel region;
a gate over the channel region; and
a spacer about the gate,
wherein the first and second PTM regions are aligned under the spacer in the semiconductor substrate, and
wherein each PTM region includes a material selected from a group comprising: vanadium dioxide ($VO_2$), and vanadium oxide ($V_2O_5$), and
wherein the first source/drain region and the second source/drain region and the channel region include a semiconductor material.

10. The transistor of claim 9, wherein the first source/drain region and the second source/drain region and the channel region have a substantially uniform dopant concentration, forming a junctionless transistor.

11. The transistor of claim 10, wherein the first source/drain region and the second source/drain region and the channel region have a dopant concentration of greater than $10^{19}$ cm$^{-3}$.

12. The transistor of claim 9, wherein the first source/drain region and the second source/drain region and the channel region have an n-type dopant.

13. The transistor of claim 9, wherein, depending on temperature, each PTM region has one of two states: a dielectric state and a conductive state.

14. The transistor of claim 9, wherein the semiconductor substrate includes a semi conductor-on-insulator (SOI) substrate including a semiconductor-on-insulator (SOI) layer over a buried insulator layer over a base semiconductor layer, wherein the first PTM region and the second PTM region contact the buried insulator layer.

15. The transistor of claim 14, wherein the SOI layer has a thickness of no greater than 10 nanometers.

16. A method, comprising:
forming a first phase transition material (PTM) region horizontally between a first source/drain region and a channel region in a semiconductor substrate, and a second PTM region horizontally between a second source/drain region and the channel region in the semiconductor substrate; and
forming a gate over the channel region.

17. The method of claim 16, wherein forming the first PTM region and the second PTM region includes:
forming a gate structure over the semiconductor substrate, the gate structure including a gate body and a spacer thereabout;
etching to remove an upper layer of the semiconductor substrate from under the spacer, leaving the channel region under the gate body;
forming a PTM layer on the semiconductor substrate, including under the spacer;
removing the PTM layer from over the semiconductor substrate, forming the first PTM region and the second PTM region under the spacer with the channel region therebetween; and
forming the first source/drain region on the semiconductor substrate adjacent the first PTM region, and the second source/drain region on the semiconductor substrate adjacent the second PTM region.

18. The method of claim 16, wherein forming the first source/drain region and the second source/drain region on the semiconductor substrate includes:
forming a semiconductor layer over the substrate adjacent each of the first PTM region and the second PTM region; and
doping to form the first source/drain region and the second source/drain region,
wherein the first source/drain region and the second source/drain region and the channel region have a substantially uniform dopant concentration.

19. The method of claim 18, wherein forming the first PTM region and the second PTM region includes forming each to have a predefined transition threshold from a dielectric to a conductor based at least one a material of the PTM layer, a dopant therein and a strain therein.

20. The method of claim 16, wherein each PTM region includes material selected from a group comprising: vanadium dioxide ($VO_2$), and vanadium oxide ($V_2O_5$), and the first source/drain region and the second source/drain region and the channel region include a semiconductor material.

* * * * *